United States Patent
Kubo et al.

(10) Patent No.: US 7,342,351 B2
(45) Date of Patent: Mar. 11, 2008

(54) PIEZOELECTRIC ELECTRONIC COMPONENT, AND PRODUCTION METHOD THEREFOR, AND COMMUNICATION EQUIPMENT

(75) Inventors: Ryuichi Kubo, Ishikawa-ken (JP); Hidetoshi Fujii, Ishikawa-ken (JP); Naoko Aizawa, Yasu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 47 days.

(21) Appl. No.: 10/558,592

(22) PCT Filed: Apr. 7, 2004

(86) PCT No.: PCT/JP2004/004992

§ 371 (c)(1),
(2), (4) Date: Nov. 28, 2005

(87) PCT Pub. No.: WO2004/105237

PCT Pub. Date: Dec. 2, 2004

(65) Prior Publication Data

US 2007/0013268 A1    Jan. 18, 2007

(30) Foreign Application Priority Data

May 26, 2003    (JP) .............................. 2003-147096

(51) Int. Cl.
*H01L 41/053* (2006.01)
(52) U.S. Cl. ..................... 310/344; 310/340
(58) Field of Classification Search ............... 310/340, 310/344

See application file for complete search history.

(56) References Cited

U.S. PATENT DOCUMENTS

| 7,248,133 | B2 * | 7/2007 | Koga et al. ................. 333/193 |
| 2002/0036448 | A1 * | 3/2002 | Kageyama et al. ......... 310/348 |
| 2004/0125970 | A1 * | 7/2004 | Kawakubo ................... 381/190 |
| 2004/0145278 | A1 * | 7/2004 | Iwamoto ..................... 310/348 |
| 2006/0131998 | A1 * | 6/2006 | Aoki et al. ................. 310/340 |
| 2007/0096605 | A1 * | 5/2007 | Fujii et al. .................. 310/348 |

FOREIGN PATENT DOCUMENTS

| JP | 58-175314 | 10/1983 |
| JP | 63-177605 | 7/1988 |

(Continued)

OTHER PUBLICATIONS

Written Opinion dated Jul. 27, 2004 from corresponding International Application (including English translation thereof).

*Primary Examiner*—Thomas M. Dougherty
(74) *Attorney, Agent, or Firm*—Dickstein Shapiro LLP

(57) ABSTRACT

A piezoelectric electronic component for use in a cellular phone or the like and capable of achieving reductions in size and profile is provided. A piezoelectric element oscillating in response to application of an input signal and outputting an output signal corresponding to the oscillations is provided on a substrate. The piezoelectric element includes a pad, the pad inputting and outputting the input and output signals. A shell member serving as a sealing member and having an insulation film covering the piezoelectric element is provided on the substrate, the shell member being remote from the piezoelectric element. The shell member includes a through hole above the pad, and the through hole is occluded with an electrode.

17 Claims, 13 Drawing Sheets

FOREIGN PATENT DOCUMENTS

| | | |
|---|---|---|
| JP | 4-97612 | 3/1992 |
| JP | 5-27565 | 10/1993 |
| JP | 5-267975 | 10/1993 |
| JP | 9-107263 | 4/1997 |
| JP | 2000-49565 | 2/2000 |
| JP | 2001-111371 | 4/2001 |
| JP | 2002-232253 | 8/2002 |

* cited by examiner

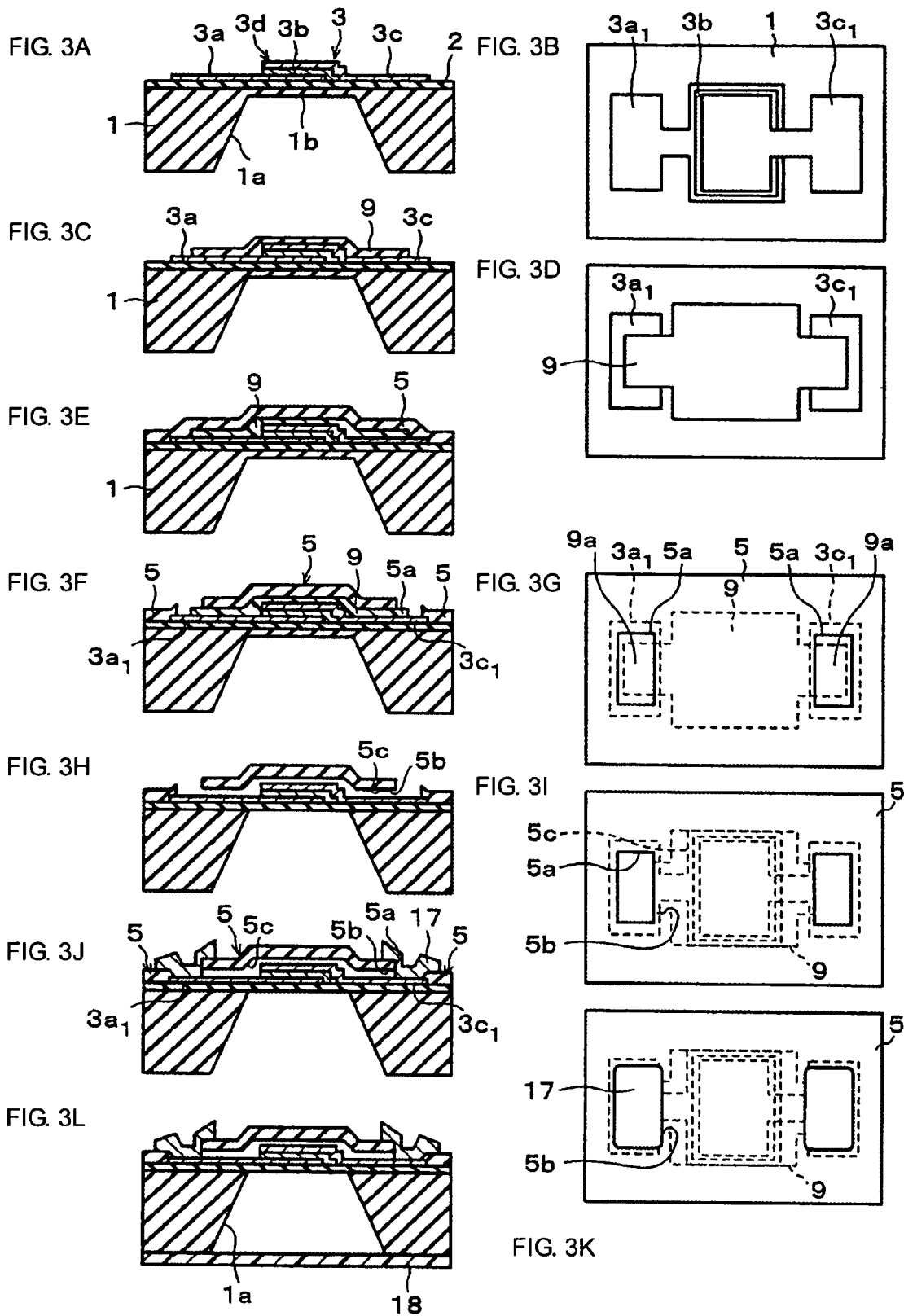

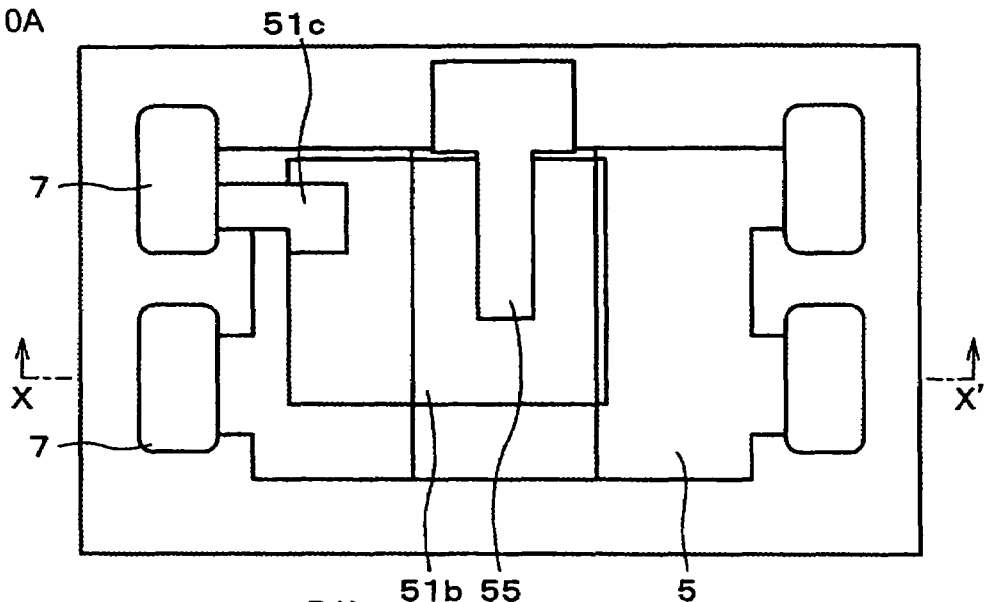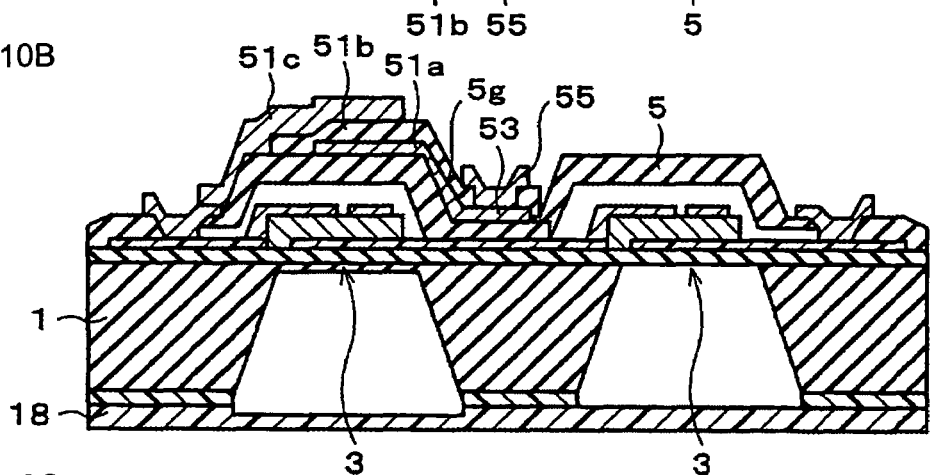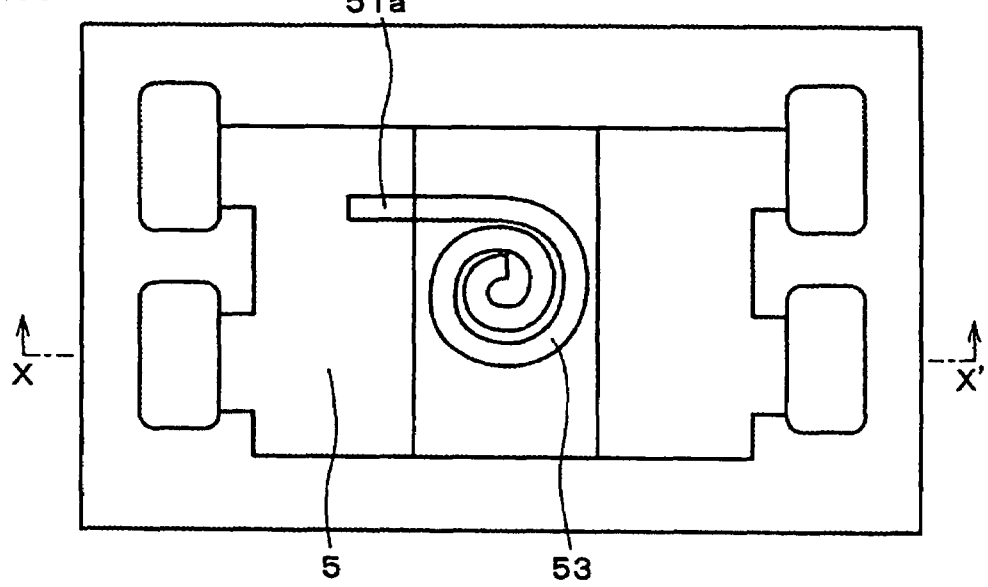

PIEZOELECTRIC ELECTRONIC COMPONENT, AND PRODUCTION METHOD THEREFOR, AND COMMUNICATION EQUIPMENT

CROSS REFERENCE TO RELATED APPLICATIONS

The present application is a national stage of PCT/JP2004/004992, filed Apr. 7, 2004, which claims priority to Japanese application No. 2003-147096, filed May 26, 2003.

FIELD OF THE INVENTION

The present invention relates to a piezoelectric component that can achieve reductions in size and profile and that is suitable as a filter used in a small communication device, a process for producing the piezoelectric component, and a communication apparatus.

BACKGROUND OF THE INVENTION

In recent years, many types of filter have been used in small communication devices, such as cellular telephones. Great demands for reductions in the size, profile, and weight of small communication devices also require reductions in the size, profile, and weight of such filters. Furthermore, in the small communication devices, an increase in the amount of information required to be communicated, for example, the increase of communication of images, has led to the communication frequencies being increased to GHz frequencies or higher.

Therefore, with such trends toward higher communication frequencies, piezoelectric filters and surface acoustic wave filters have been used as the above-described filters.

Each of the piezoelectric filters includes a plurality of piezoelectric resonators connected so as to form a ladder network or a lattice network. The piezoelectric resonators each include, for example, a Si substrate having an opening or a depression and an exciter provided on the Si substrate, the exciter covering the opening or the depression, and the exciter having a structure in which the upper and lower surfaces of a thin film portion having at least one piezoelectric thin film (composed of ZnO or AlN) are sandwiched between at least one pair of an upper electrode and a lower electrode, the upper electrode being disposed opposite the lower electrode. In such a piezoelectric filter, longitudinal oscillations generated along the thickness direction of the exciter are used; hence, it is necessary to ensure a space for the oscillations above the exciter and to protect the exciter from exposure to water, dust, and the like.

Each of the surface acoustic wave filters includes an interdigital electrode provided on a piezoelectric substrate composed of, for example, quartz, $LiTaO_3$, or $LiNbO_3$. In such a surface acoustic wave filter, it is necessary to ensure a space for oscillations above a propagation portion for surface acoustic waves on the interdigital electrode and the piezoelectric substrate and to protect the interdigital electrode from exposure to water, dust and the like.

As disclosed in Japanese Unexamined Patent Application Publication No. 5-275965 and shown in FIG. 14, in a known piezoelectric electronic component including a piezoelectric filter or a surface acoustic wave filter, a die bonding agent 75 is applied to the bottom surface of a box-shaped package 73 composed of alumina or the like, and a piezoelectric element 71, such as a piezoelectric filter or a surface acoustic wave filter, is mounted in the package 73 by die bonding. After bonding terminals in the package 73 to the corresponding electrodes of the piezoelectric element 71 with bonding wire 77, the opening of the package 73 is sealed with a lid 79 using solder 79a.

As disclosed in Japanese Unexamined Patent Application Publication Nos. 2002-232253 and 2000-49565, to enable a reduction in size, electrode lands are formed on the inner bottom surface of a package composed of alumina or the like, a piezoelectric element, such as a piezoelectric filter or a surface acoustic wave filter, is mounted on the electrode lands by flip-chip bonding. Then, the package is sealed with a lid.

However, in such a known structure, if a piezoelectric element, such as a piezoelectric filter or a surface acoustic wave filter, is reduced in size and profile, unless the package is also reduced in size and profile, the total size of a piezoelectric electronic component including the piezoelectric filter or a surface acoustic wave filter cannot be reduced, which is disadvantageous. Furthermore, in such a known structure, the package is often composed of a poorly processable material, such as alumina; hence, a reduction in the size of the package disadvantageously increase the process cost of the package.

In particular, in the piezoelectric filter, the exciter is provided at the opening or the depression of the substrate. Thus, impacts on the exciter in processing steps, such as dicing a piezoelectric element, picking up the piezoelectric element in mounting, and die bonding, can cause the destruction of the exciter, thereby disadvantageously reducing the yield of the resulting piezoelectric electronic components, prolonging time required for dicing, and increasing cost.

SUMMARY OF THE INVENTION

To overcome the problems, a piezoelectric electronic component includes a substrate; a piezoelectric element provided on the substrate, the piezoelectric element oscillating in response to application of an input signal, and the piezoelectric element outputting an output signal corresponding to the oscillations; a plurality of pads provided at the piezoelectric element; and a sealing member composed of an insulating film, the sealing member covering the piezoelectric element and being remote from the piezoelectric element, wherein the sealing member includes a through hole on each of the pads, the through hole connecting an internal space with an external space, the internal space being ensured by providing the sealing member so that the sealing member is remote from the piezoelectric element, and an electrode is provided so as to occlude the through hole.

In the above structure, by providing the sealing member so that the sealing member is remote from the piezoelectric element in the structure, it is possible to protect the piezoelectric element without inhibiting the oscillations of the piezoelectric element, to provide the sealing member close to the piezoelectric element, and to achieve reductions in size and profile. Furthermore, if an external force, such as an impact, acts on the piezoelectric element, the external force is partially absorbed into the sealing member, thereby improving impact resistance.

The sealing member is preferably composed of at least one compound selected from the group consisting of a silicon nitride such as SiN, a silicon oxide such as $SiO_2$, an aluminum oxide such as $Al_2O_3$, an aluminum nitride such as AlN, a zinc oxide such as ZnO, a silicon oxynitride such as $SiO_xN_y$, and a tantalum nitride such as TaN.

Another piezoelectric electronic component of the present invention includes a substrate; a piezoelectric element provided on the substrate, the piezoelectric element oscillating in response to application of an input signal, and the piezoelectric element outputting an output signal corresponding to the oscillations; a plurality of pads provided at the piezoelectric element; and a sealing member composed of an insulating film, the sealing member covering the piezoelectric element and being remote from the piezoelectric element, wherein the sealing member is composed of at least one compound selected from the group consisting of a silicon nitride such as SiN, a silicon oxide such as $SiO_2$, an aluminum oxide such as $Al_2O_3$, an aluminum nitride such as AlN, a zinc oxide such as ZnO, a silicon oxynitride such as $SiO_xN_y$, and a tantalum nitride such as TaN.

In the structure, the sealing member is composed of at least one compound selected from the group consisting of a silicon nitride such as SiN, a silicon oxide such as $SiO_2$, an aluminum oxide such as $Al_2O_3$, an aluminum nitride such as AlN, a zinc oxide such as ZnO, a silicon oxynitride such as $SiO_xN_y$, and a tantalum nitride such as TaN. Therefore, it is possible to protect the piezoelectric element without inhibiting the oscillations of the piezoelectric element, to provide the sealing member close to the piezoelectric element, and to achieve reductions in size and profile. Furthermore, if an external force, such as an impact, acts on the piezoelectric element, the external force is partially absorbed into the sealing member, thereby improving impact resistance.

In the piezoelectric electronic component, the sealing member preferably has a multilayer structure and preferably includes at least one film having a compressive stress and at least one film having a tensile stress.

In the piezoelectric electronic component, the film having a compressive stress may be composed of at least one compound selected from the group consisting of $SiO_2$, ZnO, and TaN. In the piezoelectric electronic component, the film having a tensile stress may be composed of at least one compound selected from the group consisting of $Al_2O_3$, SiN, and AlN.

In the piezoelectric electronic component, the sealing member has a multilayer structure, and the uppermost layer may be composed of a resin. In the piezoelectric electronic component, the resin may be composed of at least one compound selected from the group consisting of a polyimide, an epoxy resin, a resist resin, and a liquid-crystalline polymer.

The piezoelectric electronic component may include a connecting hole provided at the periphery of the sealing member, the connecting hole connecting the interior of the sealing member with the exterior, and an electrode provided so as to occlude the connecting hole, the electrode inputting and outputting the input and output signals.

In the piezoelectric electronic component, the piezoelectric element may be a piezoelectric resonator including a substrate having an opening or a depression and an exciter covering the opening or the depression, the exciter having a structure in which the upper and lower surfaces of a thin film portion including at least one piezoelectric thin film are sandwiched between at least one pair of an upper electrode and a lower electrode, the upper electrode and lower electrode being disposed opposite each other.

In the piezoelectric electronic component, the piezoelectric element may be a piezoelectric filter including a plurality of piezoelectric resonators, each containing a substrate having an opening or a depression and an exciter covering the opening or the depression, the exciter having a structure in which the upper and lower surfaces of a thin film portion including at least one piezoelectric thin film are sandwiched between at least one pair of an upper electrode and a lower electrode, the upper electrode and lower electrode being disposed opposite each other.

In the piezoelectric electronic component, the piezoelectric element may be a surface acoustic wave device having at least one interdigital electrode on a piezoelectric substrate. In the piezoelectric electronic component, an electrical circuit may be provided on the sealing member.

To overcome the problems, in a process for producing a piezoelectric electronic component in order that a sealing member composed of an insulating film includes a cavity to cover a piezoelectric element on a substrate, the sealing member being remote from the piezoelectric element, the process includes the steps of: forming a sacrificial layer on the piezoelectric element, the sacrificial layer corresponding to the cavity; forming the sealing member on the entire surface of the sacrificial layer; partially removing the sealing member to form an exposed portion partially exposing the sacrificial layer; and removing the sacrificial layer from the exposed portion.

In the process, the sealing member is partially removed to form an exposed portion partially exposing the sacrificial layer. Therefore, it is possible to ensure the removal of the sacrificial layer from the exposed portion and to ensure the formation of the sealing member composed of the insulating film and including the cavity, the sealing member being remote from the piezoelectric element.

Furthermore, in the process, when the sacrificial layer having a small thickness is provided, the sealing member on the sacrificial layer can be disposed close to the piezoelectric element and can be integrally provided with the substrate. Thereby, it is possible to achieve reductions in the size and profile of the resulting piezoelectric electronic component.

In the production process, the sacrificial layer may be formed into a taper, the height of the taper decreasing toward one of the ends of the formed pattern of the sacrificial layer. According to the process, the sacrificial layer is formed into a taper, the height of the taper decreasing toward one of the ends of the formed pattern of the sacrificial layer. Therefore, the height of the exposed portion serving as a drain for removing the sacrificial layer can be easily controlled, thus ensuring the formation of the cavity. In the production process, the exposed portion may be formed at a position facing a pad in the piezoelectric element, the pad being used for inputting and outputting signals. According to the process, the exposed portion may be formed at a position facing a pad in the piezoelectric element, the pad being used for inputting and outputting signals. Therefore, the pad connecting to the exterior can double as part of the drain for removing the sacrificial layer, thus simplifying the production process.

In the production process, the sacrificial layer may be formed on the piezoelectric element and the substrate while part of a pad for inputting and outputting signals remains. According to the process, the sacrificial layer may be formed on the piezoelectric element and the substrate while part of a pad for inputting and outputting signals remains. Therefore, it is possible to fix the piezoelectric element on the substrate, the piezoelectric element being disposed between the sealing member and the substrate. Consequently, the impact strength of the resulting piezoelectric electronic component can be improved as described above.

BRIEF DESCRIPTION OF THE DRAWINGS

FIGS. 3A-3L are each a process drawing showing another production step of the piezoelectric electronic component.

FIGS. 8A-8B show an example of a sacrificial layer used for producing a piezoelectric electronic component of the present invention, wherein FIG. 8a is a plan view, and FIG. 8B is a perspective view.

FIGS. 10A-10C show a piezoelectric electronic component according to a fourth embodiment of the present invention, wherein FIG. 10A is a plan view, FIG. 10B is a cross-sectional view taken along line X-X' in FIG. 10A, and FIG. 10C is a plan view showing a conductor for forming an inductor on the shell member of the piezoelectric electronic component.

FIGS. 12A-12B show the piezoelectric electronic component according to the fifth embodiment, wherein FIG. 12A is a cross sectional view, and FIG. 12B (b) is a plan view.

FIGS. 13A-13B show a modified example of the piezoelectric electronic component according to the fifth embodiment, wherein FIG. 13A is a cross-sectional view, and FIG. 13B is a plan view.

DETAILED DESCRIPTION OF THE INVENTION

Embodiments of the present invention will now be described with reference to FIGS. 1 to 13B.

First Embodiment

A piezoelectric component according to a first embodiment of the present invention will be described on the basis of FIGS. 1 to 3.

Figure 1:
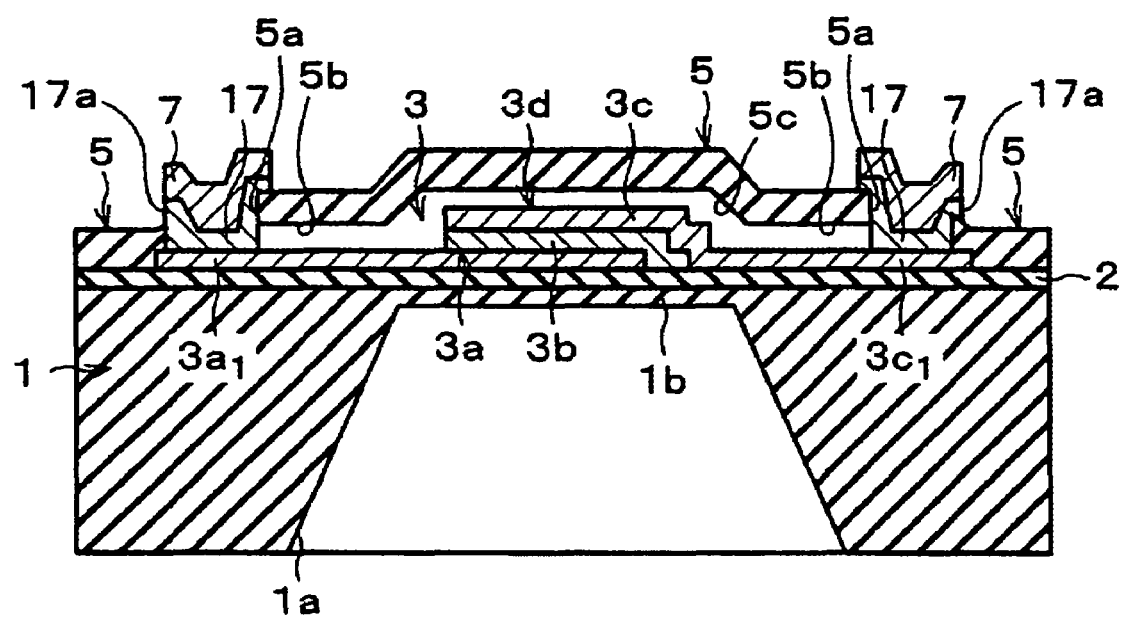
FIG. 1 is a cross-sectional view of a piezoelectric electronic component according to a first embodiment of the present invention.

As shown in FIG. 1, the piezoelectric component includes a piezoelectric element 3 for producing oscillations according to an applied input signal and outputting an output signal corresponding to the oscillations, a shell member (sealing member) 5 covering the piezoelectric element 3 and being remote from the piezoelectric element 3, through holes 5a provided at the periphery of the shell member 5, the through holes 5a each connecting the internal space provided with the shell member 5 and the exterior, and a plurality of electrodes 17 for inputting and outputting the input signal and the output signal, respectively, the electrodes 17 filling in the through holes 5a. The through holes 5a are filled with the electrodes 17 to secure hermeticity of the internal space and to permit the input and output of the electrical signals between the piezoelectric element 3 and the exterior.

The shell member 5 covering piezoelectric element 3 and being remote from the piezoelectric element 3 includes a cavity 5c serving as an internal space and a plurality of connecting holes 5b. The connecting holes 5b are disposed at the periphery of the cavity 5c, and serve as paths for introducing an etchant for forming the cavity 5c and then draining etched component dissolved in the etchant to the exterior.

A material comprising the shell member 5 preferably has the following properties: (1) being insulating; (2) ensuring hermeticity; and (3) having resistance to an etchant for a sacrificial layer 9 described below.

The piezoelectric element 3 is an piezoelectric resonator including a silicon (Si) substrate 1 having an opening 1a and an exciter (diaphragm) 3d provided above the opening 1a, the exciter 3d having a structure in which the upper surface and the lower surface of a thin film portion including at least one piezoelectric thin film 3b are sandwiched between at least one pair of an upper electrode 3c and a lower electrode 3a, the upper electrode 3c and lower electrode 3a being disposed opposite each other. In the piezoelectric element 3, a depression having a space between the exciter 3d and the silicon substrate 1 may be provided in place of the opening 1a provided through the silicon substrate 1 in the thickness direction. An insulating film 2 is provided on the entire surface of the silicon substrate 1, the insulating film 2 being disposed between the silicon substrate 1 and the exciter 3d. Examples of the insulating film 2 include single-layer insulating films composed of silicon nitrides such as SiN, silicon oxides such as $SiO_2$, aluminum oxides such as $Al_2O_3$, aluminum nitrides such as AlN, zinc oxides such as ZnO, silicon oxynitrides such as $SiO_xN_y$, or tantalum nitrides such as TaN; and insulating films each having a multilayer structure in which two or more layers of a single-layer insulating film are stacked.

The upper electrode 3c further includes a strip-shaped first lead extending from the exciter 3d to one end (first direction) of the silicon substrate 1 along the surface of the silicon substrate 1; and a substantially rectangular flat first pad $3c_1$ at the end of the first lead. The lower electrode 3a further includes a strip-shaped second lead extending from the exciter to the other end (second direction opposite the first direction) of the silicon substrate 1 along the surface of the silicon substrate 1; and a substantially rectangular flat second pad $3a_1$.

The plurality of electrodes 17 are electrically connected to the first pad $3c_1$ and the second pad $3a_1$ at the bottom of each of the electrodes 17, and occlude the connecting holes 5b and the through holes 5a. Furthermore, the electrodes 17 each include a flange 17a at the end of the electrodes 17, the flange 17a extending outwardly on the surface of the shell member 5 along the surface of the shell member 5.

The shell member 5 is also fixed on the silicon substrate 1 with the flanges 17a. Therefore, even if external forces, such as vibrations and impacts, are applied to the silicon substrate 1, the external forces act separately on the piezoelectric element 3 and the shell member 5, thus suppressing the power of the external forces applied to the piezoelectric element 3. Thereby, it is possible to protect the piezoelectric element 3.

The shell member 5 is fixed on the silicon substrate 1 at the periphery of the shell member 5. Furthermore, part of the periphery of the shell member 5 is disposed on the silicon substrate 1 with at most three peripheral edges of the first pad $3c_1$ therebetween, except for the end of the first pad $3c_1$ connected to the first lead. Another part of the periphery of the shell member 5 is disposed on the silicon substrate 1 with at most three peripheral edges of the second pad $3a_1$ therebetween, except for the end of the second pad $3a_1$ connected to the second lead.

In this way, the periphery of the shell member 5 is fixed on the silicon substrate 1 with part of the first pad $3c_1$ and part of the second pad $3a_1$ therebetween. Therefore, even if external forces, such as vibrations and impacts, are applied to the silicon substrate 1, the external forces act separately on the piezoelectric element 3 and the shell member 5, thus suppressing the power of the external forces applied to the piezoelectric element 3. Thereby, it is possible to protect the piezoelectric element 3.

Next, steps included in a process for producing the piezoelectric component will be described below with reference to FIGS. 2A to 2J and FIGS. 3A to 3L.

In the production process, as shown in FIGS. 3A and 3B, the insulating film 2 is entirely formed on a surface of the silicon substrate 1 having a substantially rectangular parallelepiped shape. Then, the piezoelectric element 3 having the structure of a bulk acoustic wave (BAW) resonator including lower electrode $3a$/piezoelectric thin film $3b$/upper electrode $3c$ is formed on the insulating film 2. Subsequently, the silicon substrate 1 is subjected to anisotropic etching from the side opposite the surface having the piezoelectric element 3 toward the piezoelectric element 3, thereby forming the opening $1a$.

At this time, the anisotropic etching is performed in a manner such that a portion of the silicon substrate 1 having a thickness of several tens of micrometers is formed at a position facing the piezoelectric element 3 to form a thin film-supporting portion $1b$ for supporting the exciter $3d$ on the silicon substrate 1.

Figure 2A:
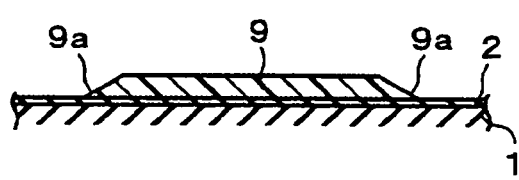
FIGS. 2A-2J are each a process drawing showing a production step of the piezoelectric electronic component.

Subsequently, as shown in FIGS. 3C and 3D and FIG. 2A, the pattern of the sacrificial layer 9 is formed on the piezoelectric element 3 by photolithography. When the pattern of the sacrificial layer 9 is formed, proximity exposure, in which exposure is performed while a mask is remote from an object to be etched, is performed. Thereby, a taper $9a$ whose height gradually decreases toward the outside (edge of the pattern) is formed at the periphery of the sacrificial layer 9.

By providing such a taper $9a$, the size of the connecting hole $5b$ can be controlled. Furthermore, as described below, the formation of the cavity $5c$, which is the internal space of the shell member 5, can be stabilized, and the entry of an electrode material into the cavity $5c$ can be suppressed in forming an electrode 7. Thereby, it is possible to stabilize the production of the piezoelectric component.

The sacrificial layer 9 should be composed of a material such that an etchant for removing the sacrificial layer 9 by dissolution does not cause damage to the thin film material of the piezoelectric element 3 and the shell (exterior) member. Examples of the material of the sacrificial layer 9 include water-soluble antimony (Sb), resins (e.g., resist resins) removable with an organic solvent, zinc oxide (ZnO) and germanium (Ge) capable of being etched with a dilute acid, and phosphosilicate glass (PSG) and polysilicon capable of being dissolved in hydrofluoric acid. Zinc oxide has satisfactory heat resistance and thus can be used to form the shell member. A SiN film or a $SiO_2$ film having satisfactory film quality and requiring a high film-forming temperature can be used.

When the sacrificial layer 9 is formed on the piezoelectric element 3, the sacrificial layer 9 does not cover the entire surface of the piezoelectric element 3. That is, the sacrificial layer 9 is formed in a manner such that the sacrificial layer 9 covers the area of the piezoelectric element 3 other than the periphery of the pad $3a_1$, which is used for electrically connecting to the exterior, of the lower electrode $3a$ and the periphery of the pad $3c_1$, which is used for electrically connecting to the exterior, of the upper electrode $3c$ of the piezoelectric element 3. Consequently, the shell member 5 will be formed on the silicon substrate 1 with the peripheries of the pads $3a_1$ and $3c_1$ of the respective lower and upper electrodes $3a$ and $3c$ provided therebetween; hence, the strength of the piezoelectric element 3 bonded to the silicon substrate 1 can be improved.

Figure 2B:
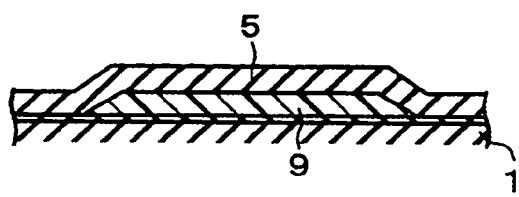

As shown in FIGS. 2B and 3E, the film of the shell member 5 is formed on the entire surface of the sacrificial layer 9 and the silicon substrate 1. The shell member 5 is preferably composed of a material having a low membrane stress and satisfactory hermeticity and moisture resistance. An example of thereof is a silicon dioxide (SiO2) film formed by RE sputtering.

Figure 2C:
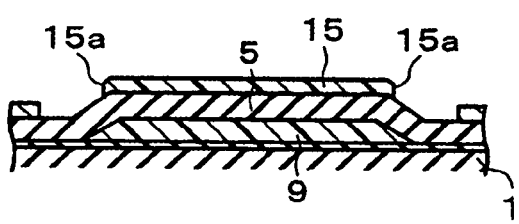
Figure 2D:
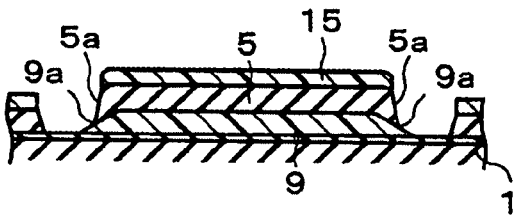

Subsequently, as shown in FIG. 2C, a resist film 15 is formed on the shell member 5, and windows $15a$ for etching are formed at positions corresponding to the pads by photolithography. As shown in FIG. 2D, the corresponding portions of the shell member 5 are removed by etching through the windows $15a$.

Figure 2E:
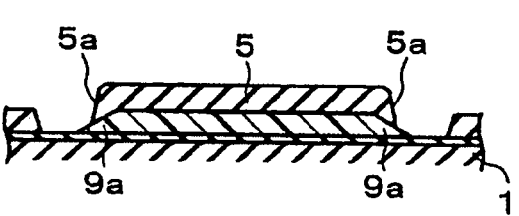

As shown in FIGS. 3F and 3G and FIG. 2E, the remaining resist film 15 is removed. At this time, the through holes $5a$ for exposing the tapers $9a$, which are disposed at the periphery of the sacrificial layer 9, at the pads $3a1$ and $3c1$ are formed in the shell member 5.

Figure 2F:
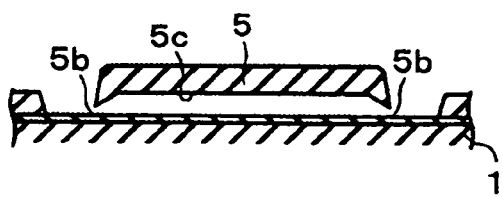

Subsequently, as shown in FIG. 2F and FIGS. 3H and 3I, the sacrificial layer 9 is removed with a solvent capable of dissolving the sacrificial layer 9 (for example, when the sacrificial layer 9 is composed of a resist resin, the solvent is acetone or the like) via the through holes $5a$ and the exposed tapers $9a$ to form the cavity $5c$ that is an internal space in the shell member 5, the cavity $5c$ being disposed between the exciter $3d$ of the piezoelectric element 3 and the inner surface of the shell member 5. At this time, connecting holes $5b$ having tapered shapes corresponding to the respective tapers $9a$ are formed in the periphery of the shell member 5.

Figure 2G:
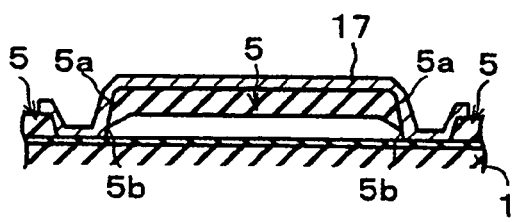

Next, the thin film-supporting portion $1b$ remaining at a position adjacent to the back surface of the exciter $3d$ is removed. As shown in FIG. 2G, the electrode layer 17 composed of copper or the like is formed on the shell member 5 and formed in a manner such that the through holes $5a$ and the connecting holes $5b$ are filled with the electrode 17. The electrode 17 is preferably formed by a film-forming method exhibiting a satisfactory coverage, for example, CVD or sputtering. Sputtering is more preferable. In the film formation, the cavity $5c$ is sealed with the electrode 17 under a pressure during the film formation. Alternatively, the film formation may be performed by applying a metal paste onto a predetermined position by mask printing and then heating.

Figure 2H:
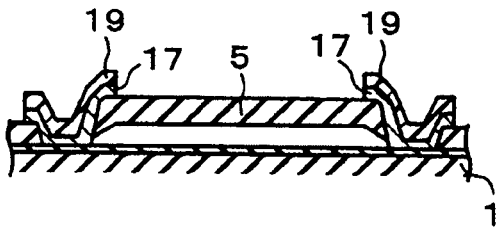

Subsequently, as shown in FIG. 2H, the unnecessary region of the electrode layer 17 is removed using a resist layers 19 for patterning the electrode, each of the resist layer 19 covering the corresponding through hole $5a$ and covering a region extending from the periphery toward the outside.

Figure 2I:
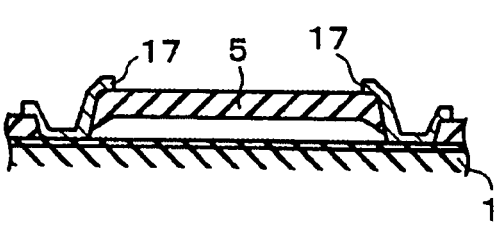

Next, the remaining resist layers 19 are removed to form the electrodes 17 shown in FIG. 1, as shown in FIG. 2I and FIGS. 3J and 3K.

Figure 2J:
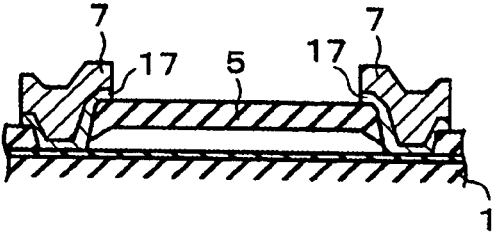
Figure 4A:
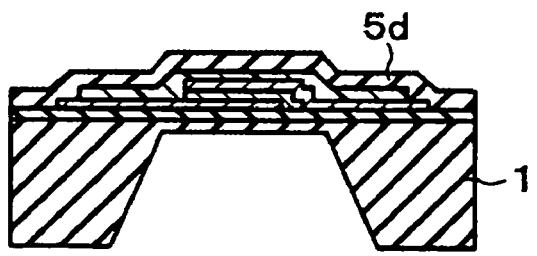
FIGS. 4A-4F are each a process drawing showing a production step of a piezoelectric electronic component according to a second embodiment of the present invention.
Figure 4B:
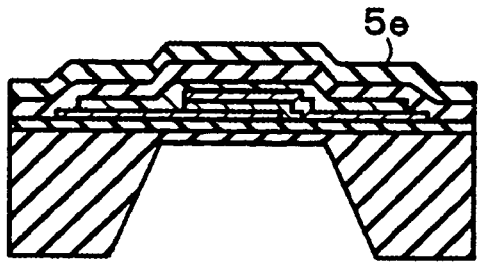
Figure 4C:
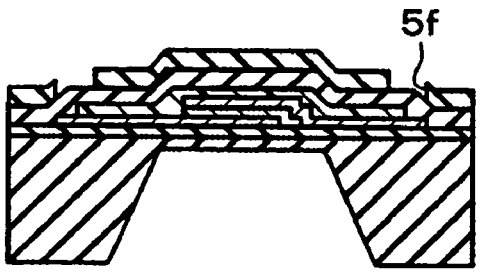
Figure 4D:
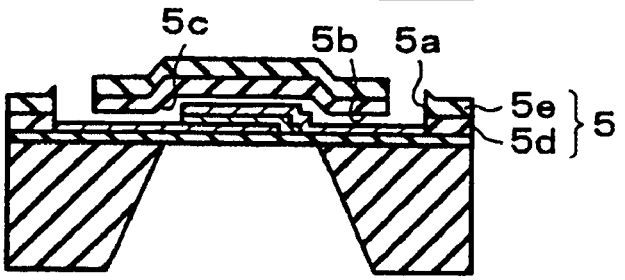
Figure 4E:
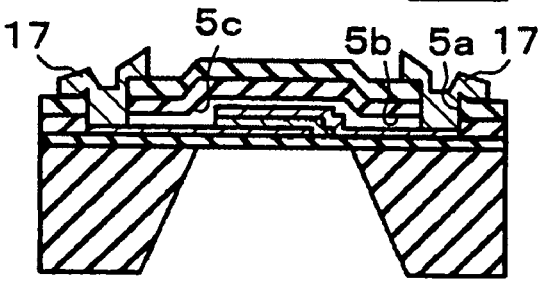
Figure 4F:
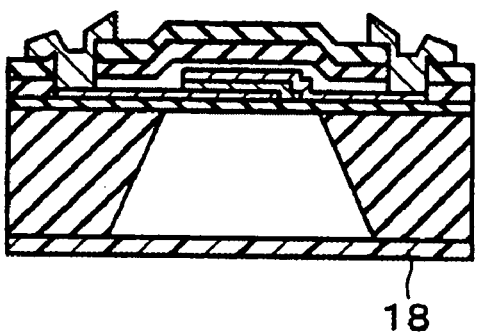

According to need, as shown in FIG. 2J, solder portions 7 may be formed on the electrodes 17 by printing. Alternatively, if the connecting holes 5b are sealed, solder balls may be formed. In the case of using solder, when the shell member 5 is composed of a material that lack an affinity for solder, for example, SiO2, metal layers composed of a metal (for example, nickel) having an affinity for solder are preferably formed at regions of the shell member 5, each of the region surrounding the opening of each through hole 5a. Furthermore, as shown in FIG. 3I, a back plate 19 for occluding the opening 1a may be mounted.

A resin layer composed of a polyimide or the like and functioning as a reinforcing component may be formed on the outermost layer of the shell member 5. In such piezoelectric electronic components, a plurality of piezoelectric electronic components are often formed on a large silicon wafer at the same time. In such a case, the piezoelectric electronic components on the silicon wafer are separated by dicing.

In the piezoelectric electronic component and the process for producing the same of the present invention, since the thin-film shell member 5 can be disposed close to the piezoelectric element 3, it is possible to achieve reductions in size and profile. Furthermore, a conventional package and lid can be omitted, and many steps of die boding, wire bonding, mounting the lid, welding, and the like can also be omitted. Thereby, it is possible to reduce cost.

Furthermore, in the piezoelectric electronic component and the process for producing the same of the present invention, since the cavity 5c can be sealed under a pressure during the film formation, sealing can be easily performed under vacuum, i.e. under reduced pressure with $10^{-2}$ Pa or less. Thus, an expensive special apparatus, such as a welding machine for welding a lid in vacuum, is unnecessary. In addition, in the piezoelectric element 3 under reduced pressure, damping due to air can be reduced, thus improving Q-value.

Furthermore, in the piezoelectric electronic component and the process for producing the same, as compared with the case of bonding a substrate for sealing, the occurrence of a stress is low, and the piezoelectric element 3 is difficult to break. In addition, wafer-level packaging can be performed at a single step, and the exciter 3d is protected with the shell member 5 in dicing, picking up, and die bonding. Therefore, it is possible to prevent the breakage of the exciter 3d.

The material constituting the sacrificial layer 9 preferably has the following properties: (I) the material can be rapidly etched because etching is performed through small etching channels, i.e., the connecting holes 5b and through holes 5a (holes through which an etchant for removing the sacrificial layer is introduced); (II) the material does not cause damage to the electrodes 3a and 3c, a device material such as the piezoelectric thin film 3b, and the structural material for the shell member 5; and (III) an etchant for etching the sacrificial layer 9 does not cause damage to the shell member 5, the electrodes 3a and 3c, and the device material, such as the piezoelectric thin film 3b.

In the production process according to the first embodiment, the preferred shape of each of the connecting holes 5b formed by exposing the tapers 9a, which is disposed on the pads $3a_1$ and $3c_1$, of the sacrificial layer 9, i.e., the preferred shapes of each of the etching channels (holes through which an etchant for removing the sacrificial layer 9 is introduced), is described below.

In view of sealing the cavity 5c, the height of the etching channel is preferably low. When the area of the etching channel is large, an area in which an etchant is brought into contact with the sacrificial layer 9 is increased, thus easily etching the sacrificial layer 9. Consequently, in view of the strength retention of the shell member 5, the etching channel preferably has a rectangular shape in which the longitudinal side (length in a direction perpendicular to the surface of the silicon substrate 1) is short and the transverse side (width in a direction parallel to the surface of the silicon substrate 1) is long.

However, an excessively long transverse side of the etching channel results in the rise of the middle of the side, thus being difficult to seal the etching channel. Experimental results confirm that when the long (transverse) side of the etching channel has a length of 30 μm, the sacrificial layer 9 can be sufficiently removed by etching.

The shape of the etching channel is not limited to C, but may be a circle, a square, or another polygon. In particular, in the case of the shape of the etching channel being a circle or a polygon, a stress is difficult to be concentrated in one direction. Thus, the etching channel is hardly destroyed by a stress.

Second Embodiment

In a second embodiment of a piezoelectric electronic component according to the present invention, as shown in FIGS. 4A-4F, the shell member 5 according to the first embodiment has a multilayer structure including, for example, a resin layer 5e composed of a polyimide serving as the outermost layer; and an inorganic insulating layer 5d composed of SiO2 or SiN, the inorganic insulating layer 5d being disposed at the inner side of the resin layer 5e. In such a case, moisture resistance and strength can be imparted by providing a multilayer structure, thus improving the reliability of the resulting piezoelectric electronic component. In the following embodiments including this embodiment, a member having the same function as that of member in the first embodiments is represented by the same reference numeral. Redundant description is not repeated.

A process for producing the piezoelectric electronic component includes forming an inorganic insulating layer composed of $SiO_2$ or SiN by the same method as that for producing the shell member 5 in the first embodiment; forming a resin layer composed of a polyimide by spin coating; patterning the resin layer by photolithography to form the resin layer 5e; and performing etching using the resulting resin layer 5e as a mask to form the inorganic insulating layer 5d. Downstream steps are identical to those in the first embodiment.

In the second embodiment, the two-layer structure including the polyimide resin layer 5e serving as the outermost layer is exemplified. Various combinations can provide the shell member 5 having various properties. For example, the shell member 5 may have three-layer structure including polyimide/$SiO_2$/$Al_2O_3$, the polyimide layer being the outermost layer.

In the multilayer structure, a combination of an inorganic insulating layer having satisfactory moisture resistance, heat resistance, and weather resistance, for example, a SiN layer, a $SiO_2$ layer, or an $Al_2O_3$, serving as the lower layer with a resin layer enhancing mechanical strength and serving as the upper layer is preferable. In particular, providing at least one SiN layer in the multilayer structure is effective in improving the moisture resistance and is also effective for the protection of an Al electrode. The shell member 5 having the multilayer structure includes a high moisture-resistant film serving as the lowermost layer and a resin provided on the film. Thus, it is possible to enhance the strength and to improve the moisture resistance of the shell member 5.

In particular, the shell member 5 may have a multilayer structure including a layer having a tensile stress and a layer having a compressive stress. The multilayer structure is preferably designed in a manner such that an absolute value (total stress) of the difference between the total of the tensile stress and the total of the compressive stress is smaller than the rupture strength of the shell member 5, and more preferably the absolute value represents zero.

For example, when a $SiO_2$ layer having a thickness of 1 µm is formed by RF sputtering, and then a SiN layer having a thickness of 1 µm is formed on the $SiO_2$ layer by RF sputtering to form the shell member 5 having a two-layer structure, the $SiO_2$ layer has a compressive stress of about 100 MPa, and the SiN layer has a tensile stress of about 100 MPa. Therefore, the total stress (absolute value of the difference between the total of the tensile stress and the total of the compressive stress) is zero. That is, it is possible to increase the thickness of the shell member 5 and to improve the strength by the cancellation of the stresses.

In the shell member 5, the $SiO_2$ layer and SiN layer each having a thickness of 1 µm can impart optical transparency to the shell member 5. Thus, the degree of removal of the sacrificial layer 9 by etching can be visually confirmed, thereby ensuring the removal. Consequently, the reliability of the resulting piezoelectric electronic component can be improved.

By using the above-described multilayer structure, it is possible to further enhance the strength of the shell member 5 and to increase the entire thickness of the shell member 5. Examples of a material constituting the layer having a tensile stress include $Al_2O_3$, SiN, and AlN. Examples of a material constituting the layer having a compressive stress include $SiO_2$, ZnO, and TaN.

In particular, the use of a SiN film or a $SiO_2$ film can impart moisture resistance to the shell member 5, can protect an electrode material (in particular, an Al electrode) and the piezoelectric thin film 3b, and can also impart heat resistance to the shell member 5. Furthermore, in particular, when a resin is used for the shell member 5, it is possible to impart impact resistance to the shell member 5.

Examples of a material for the resin layer 5e include an epoxy resin, a resist resin (photosensitive resin) having satisfactory weather resistance, and a liquid-crystalline polymer having satisfactory moisture resistance and weather resistance, in addition to a polyimide. In particular, in the case of using the resist resin, the resist resin is patterned and used the resist resin as a mask to directly form the resin layer 5e. Thereby, the production can be simplified.

A material constituting the resist resin (photosensitive resin) preferably has the following properties: (a) Patterning can be performed by photolithography (ease of patterning); (b) the shrinkage ratio during curing is low (protection of the destruction of the shell member 5); (c) Young's modulus is high after curing (sturdy and hard); (d) when heat is applied, a gas and a low-molecular-weight component are not emitted; (e) electrical characteristics are satisfactory (low dielectric constant, high resistivity); and (f) adhesion to the silicon substrate 1 is high. Specific examples of the material include a "PIMEL" (manufactured by Asahi Kasei Corporation), a "ZFPI", and a "ZCOAT" (manufactured by Zeon Corporation).

Third Embodiment

Figure 5:
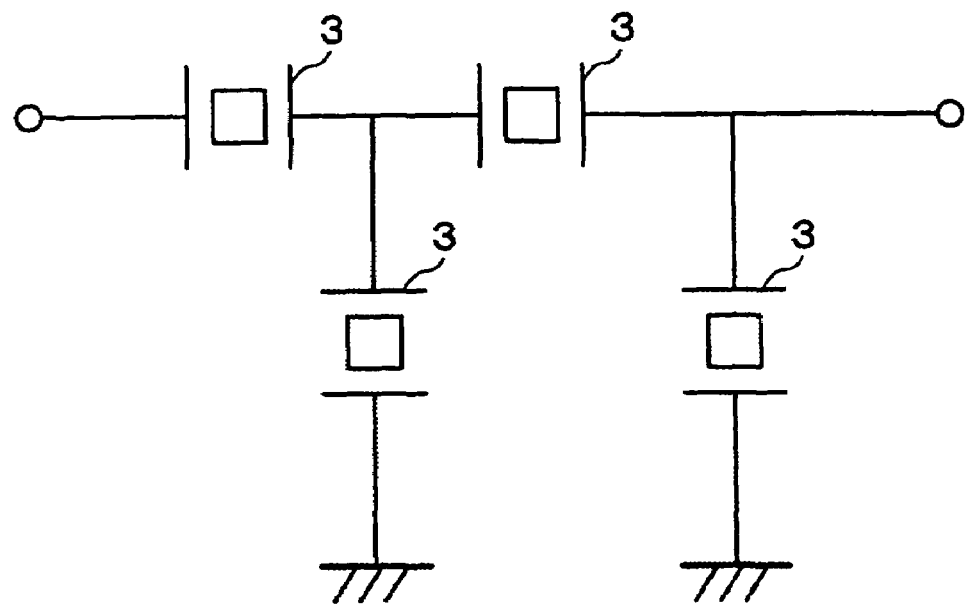
FIG. 5 is a schematic circuit diagram of an example of a piezoelectric filter.
Figure 6:
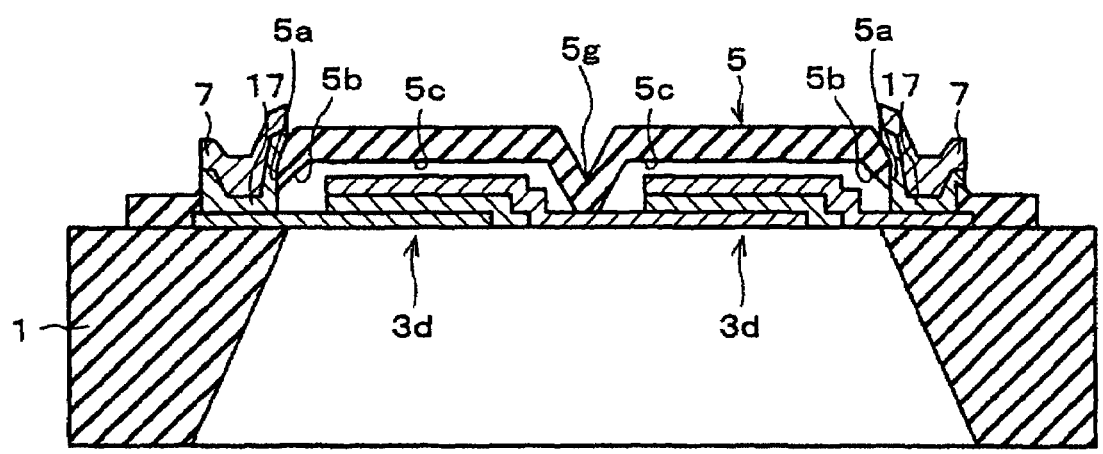
FIG. 6 is a cross-sectional view of a piezoelectric electronic component according to a third embodiment of the present invention.

A piezoelectric electronic component according to a third embodiment of the present invention is suitable for a piezoelectric filter, such as a piezoelectric filter provided on the silicon substrate 1 by combining a plurality of piezoelectric elements 3 into a ladder network as shown in FIG. 5, and a duplexer. As a combination of the plurality of the piezoelectric element 3, the ladder network is preferable because the interconnections in which the upper electrode of one piezoelectric element 3 extending along the surface of the silicon substrate 1 functions as the lower electrode of the other piezoelectric element 3 can be simplified.

Figure 7A:
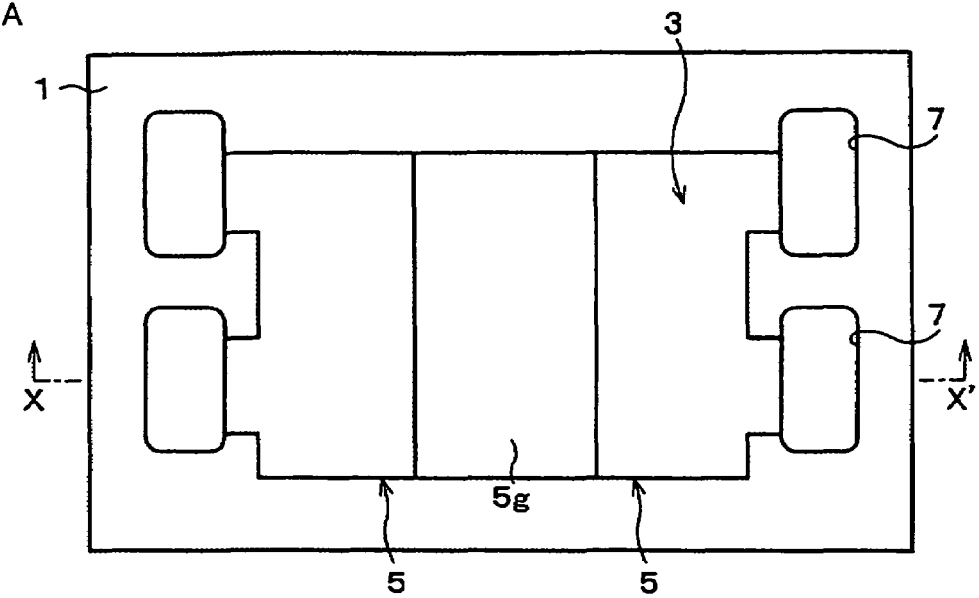
FIG. 7A is a plan view of the piezoelectric electronic component.
Figure 7B:
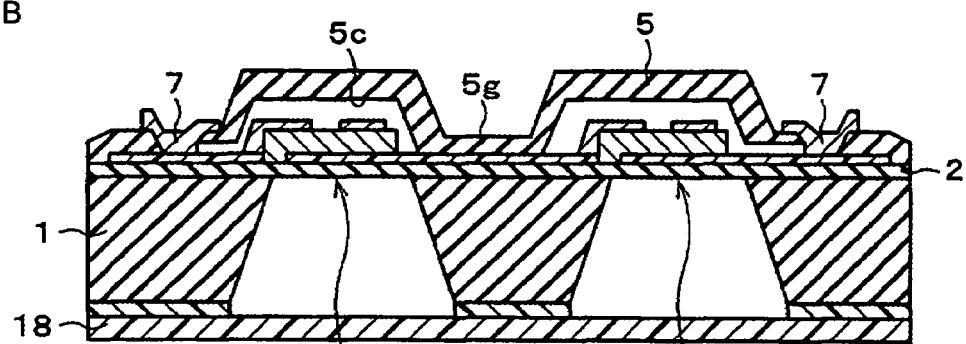
FIG. 7B is a cross-sectional view of the piezoelectric electronic component taken along line X-X' in FIG. 7A.
Figure 7C:
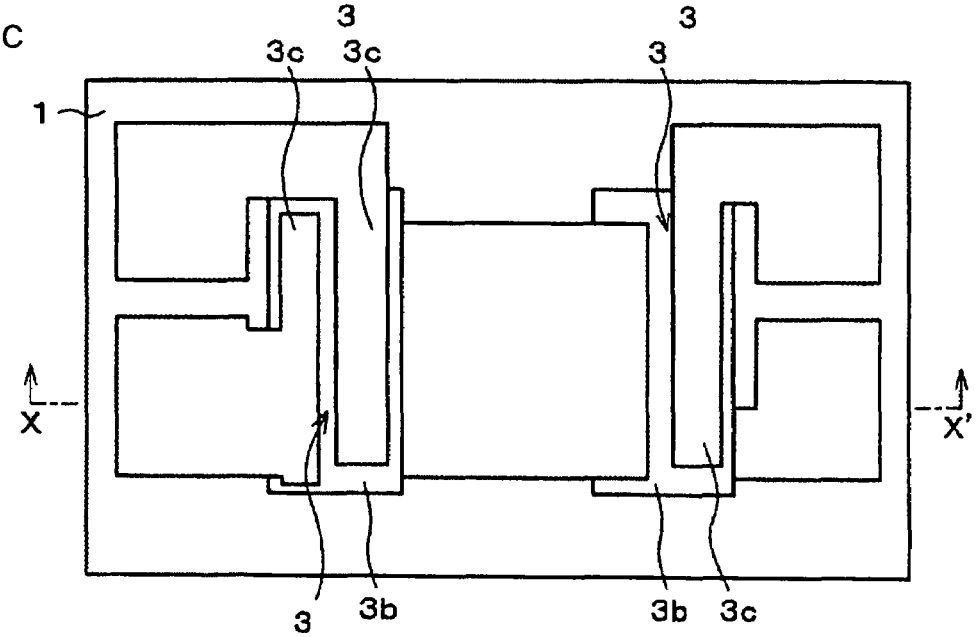
FIG. 7C is a plan view showing an electrode structure by virtually removing the shell member from the piezoelectric electronic component.

In the third embodiment, as shown in FIGS. 6 and 7A-7C, a plurality of piezoelectric elements 3 are provided on the silicon substrate 1, and the shell member 5 covering the piezoelectric elements 3 is formed by the same production process as that in the first embodiment. FIG. 7C is a schematic view illustrating the structures of the electrodes and the relationship between the electrodes by virtually removing the shell member 5 from the piezoelectric electronic component shown in FIG. 7A.

In this third embodiment, to enhance the strength of the shell member 5, an anchor portion 5g having a substantially M-shaped cross-section in a longitudinal direction (direction perpendicular to the surface of the silicon substrate 1) is fixed on the interconnection between the exciters 3d by bonding. In such a structure, heat is easy to be dissipated with the anchor portion 5g. As a result, it is possible to improve power endurance of a piezoelectric filter and duplexer using the piezoelectric element 3.

Figure 8A:
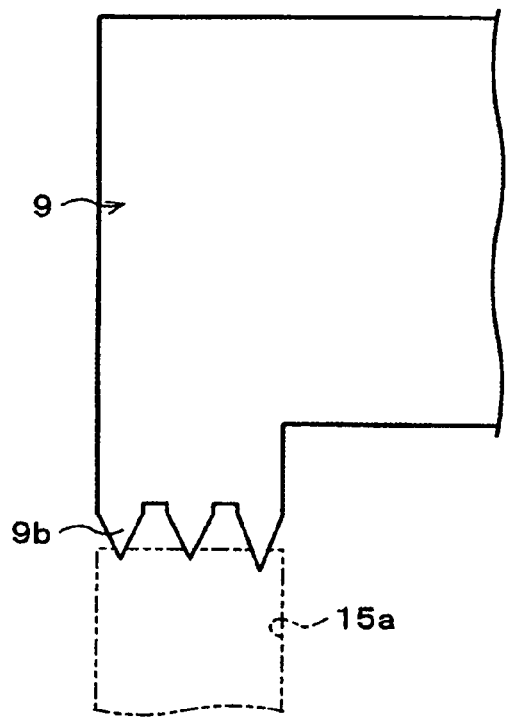
Figure 8B:
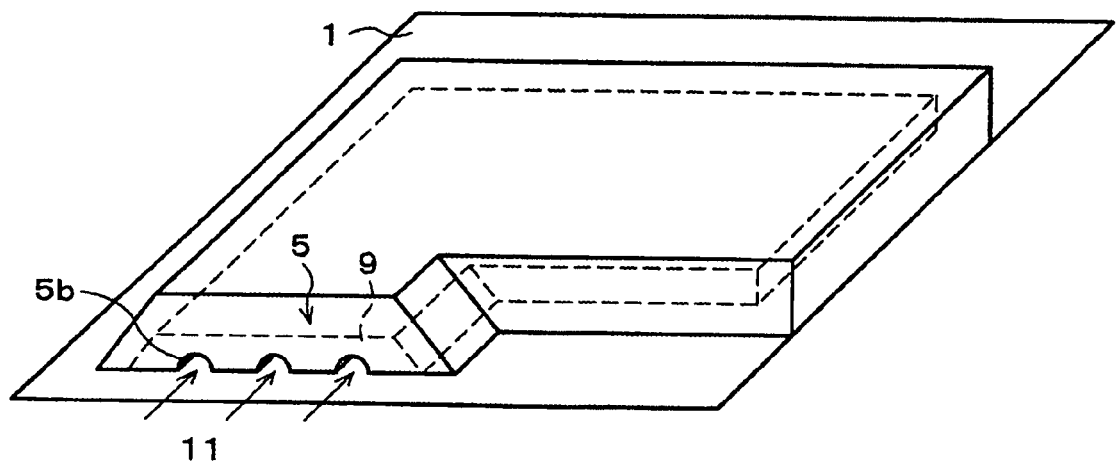

With respect to the shape of the end of the sacrificial layer 9 (end of the pattern), as shown in FIG. 8A, a wedge taper 9b whose width gradually decreases toward the end may be used in place of the taper 9a. In this case, the size of the connecting hole 5b formed from the taper 9b can be easily controlled by adjusting the position of the windows 15a for etching, thus ensuring the removal of the sacrificial layer 9 with an etchant 11.

Figure 9:
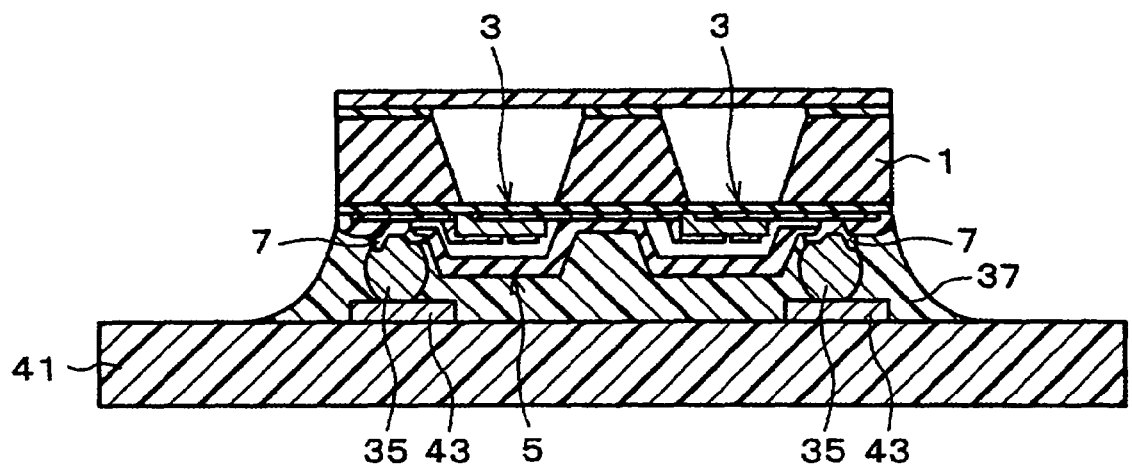
FIG. 9 is a cross-sectional view of another example of a piezoelectric filter using the piezoelectric electronic component.
Figure 11:
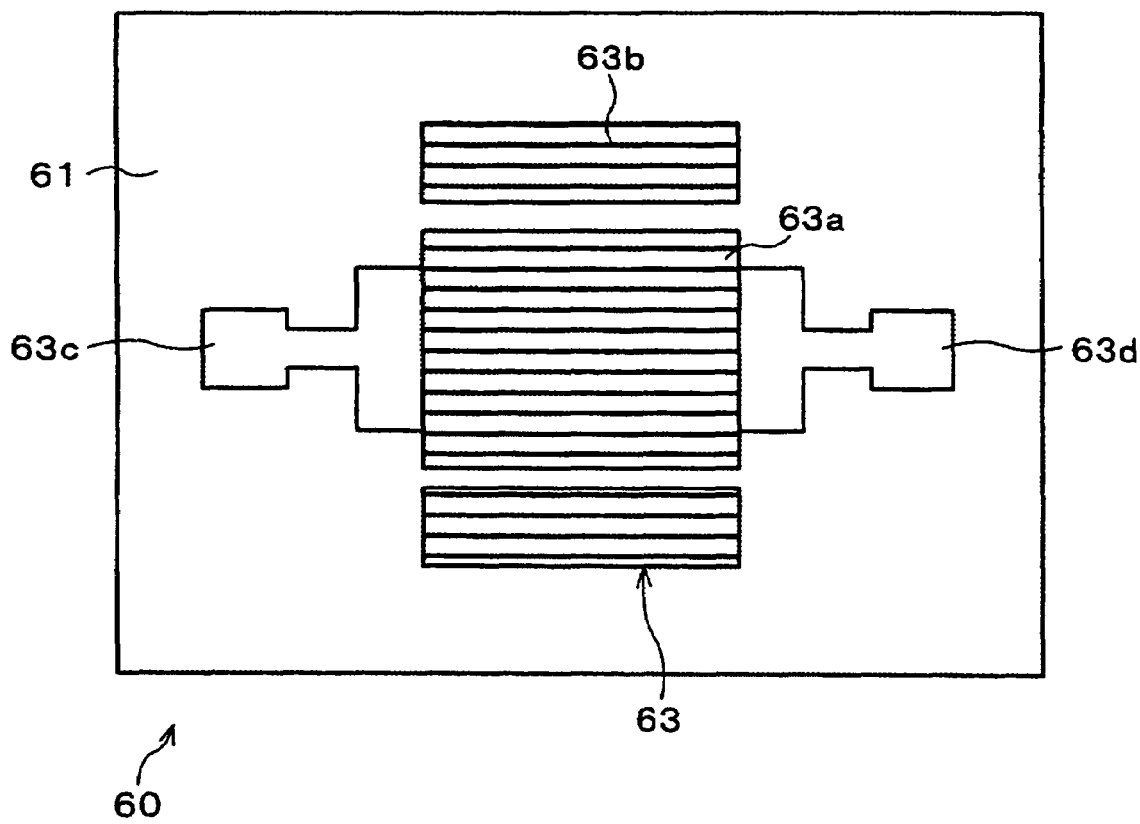
FIG. 11 is a plan view of a piezoelectric element used in a piezoelectric electronic component according to a fifth embodiment of the present invention.
Figure 12A:
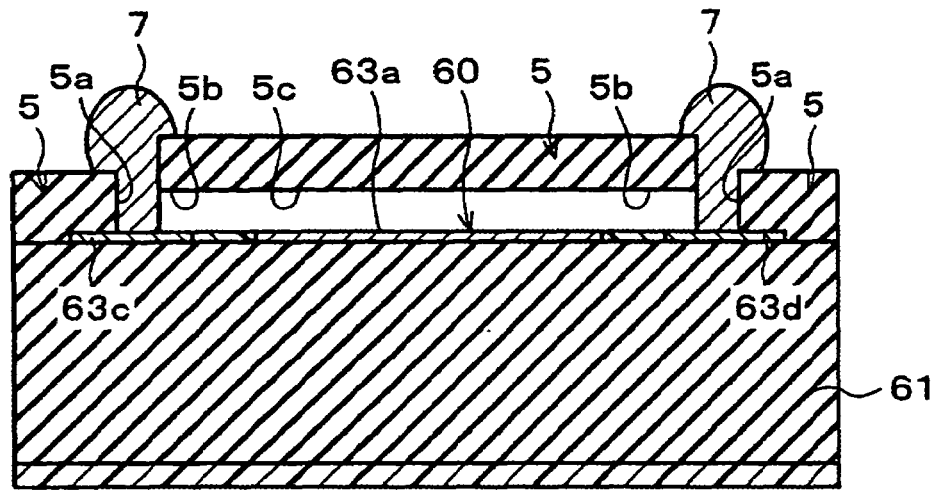
Figure 12B:
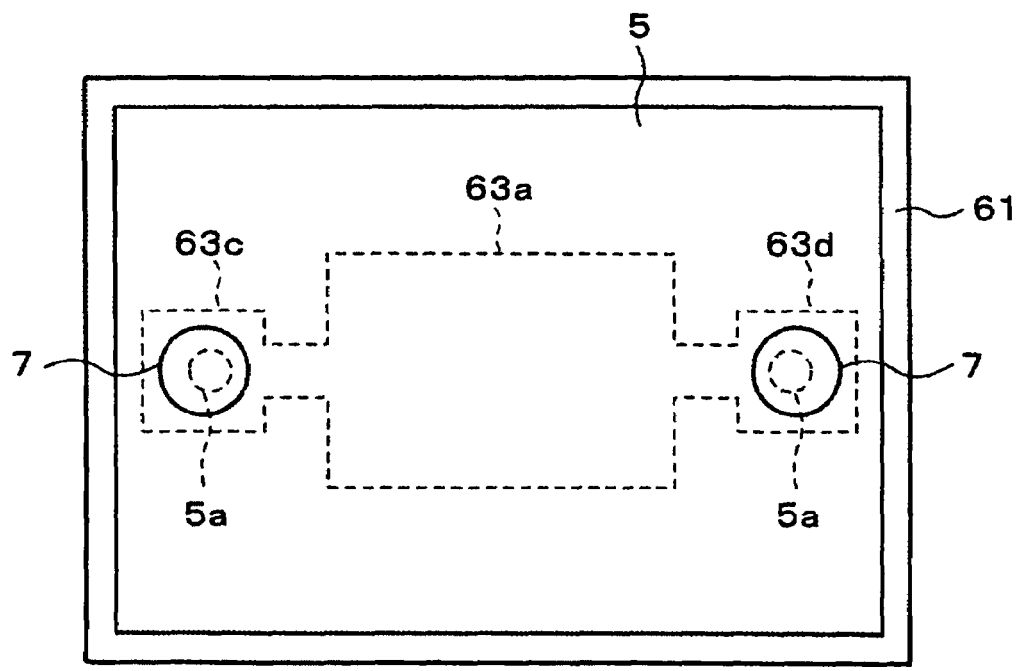

As shown in FIG. 9, in a piezoelectric electronic component according to this embodiment, electrodes 7 may be bonded to the respective electrodes 43 on a mounting substrate 41 with solder balls 35 by ball bonding, and then these electrodes may be sealed with a sealing resin 37.

In this embodiment, the filter including a plurality of piezoelectric thin-film element combined in a ladder network is exemplified. The present invention is not limited to the example. A filter may be combined to form a lattice network, and a multimode filter may be used.

Fourth Embodiment

In a piezoelectric electronic component according to a fourth embodiment of the present invention, for example, as shown in FIGS. 10A-10C, an electrical circuit is provided on the shell member 5. The electrical circuit includes a resistor, a capacitor, inductor, and the like. The electrical circuit may be formed by, for example, forming a metal film and an insulating film on the upper layer of the shell member 5, and then patterning these films into a predetermined pattern (for example, a meandering pattern for a resistor).

In this embodiment, as shown in FIGS. 10A and 10B, a capacitor can be formed by forming an insulating layer 51b composed of SiO2 or the like between an electrode layers 51a and 51c. Furthermore, as shown in FIG. 10C, a spiral conductor 53 is formed on, for example, the anchor portion 5g on the shell member 5 to form an inductor.

The electrode layer 51c is connected to the electrode 7 of the piezoelectric element 3. Therefore, a subsequent connecting step, such as wire bonding, can be omitted. As a result, the production can be simplified.

Fifth Embodiment

In a piezoelectric electronic component according to a fifth embodiment of the present invention, for example, as shown in FIGS. 11, 12A-12B and 13A-13B, a surface acoustic wave filter (hereinafter referred to as a "SAW filter") 60 having an interdigital electrode 63 is used in place of the piezoelectric element 3. The SAW filter 60 includes an interdigital electrode 63a, reflectors 63b, the interdigital electrode 63a being disposed between the reflectors 63b, and pads 63c and 63d each being connected to the interdigital electrode 63a, provided on a piezoelectric substrate 61. A member having the same function as that of member in the above-described embodiments is represented by the same reference numeral. Redundant description is not repeated.

Figure 13A:
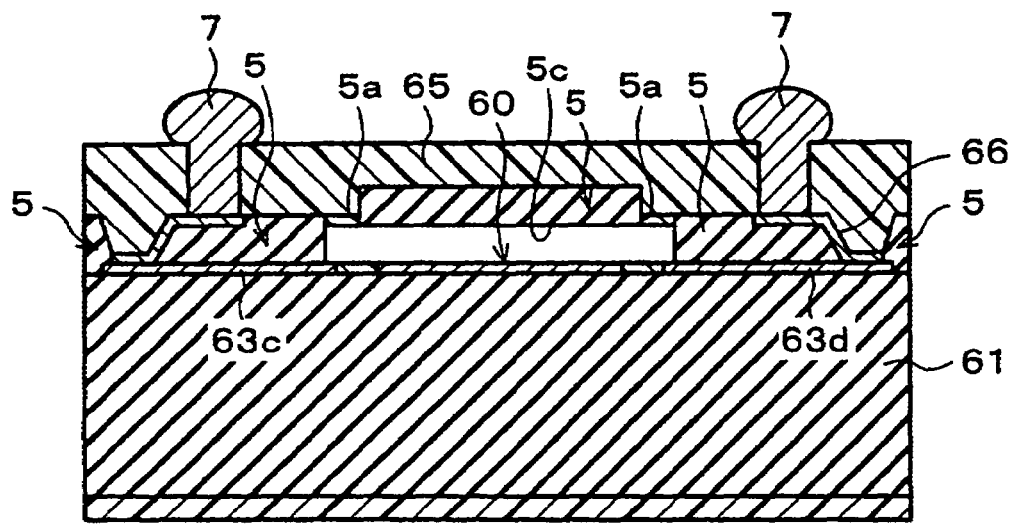
Figure 13B:
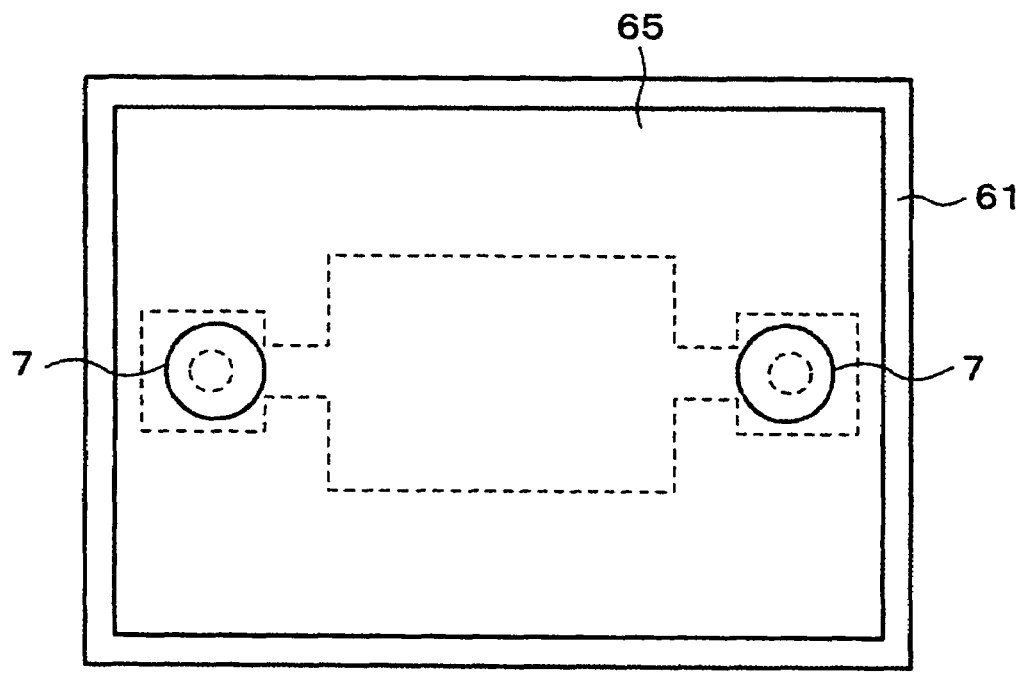
Figure 14:
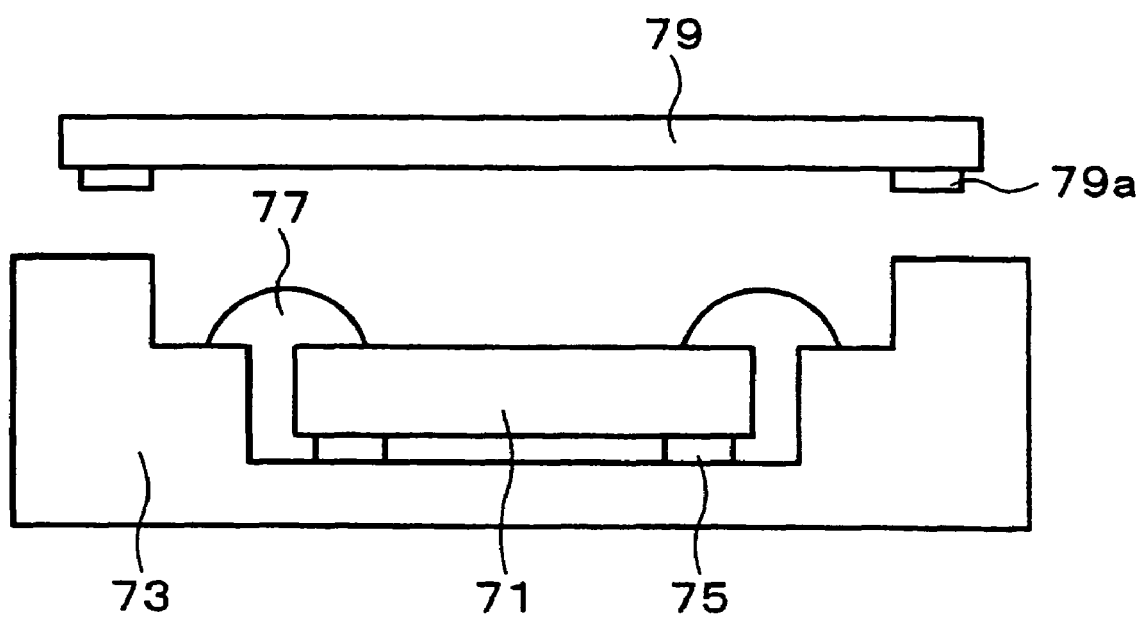
FIG. 14 is an exploded cross-sectional view of a known piezoelectric electronic component.

As shown in FIGS. 12A-12B and 13A-13B, the shell member 5 is provided on the piezoelectric substrate 61 with part of the pad 63c provided therebetween and with part of the pad 63d provided therebetween. As a result, it is possible to improve impact resistance, to achieve reduction in size and profile. In FIGS. 13A-13B, a sealing resin 65 covers the shell member 5. As a result, in this structure shown in FIG. 13, the sealing resin 65 protects the component, thus improving moisture resistance and impact resistance as compared with those of the structure shown in FIGS. 12A-12B. The pads 63c and 63d are connected to solder portions 7 with connecting electrodes 66.

Each of the piezoelectric electronic components according to the above-described embodiments can achieve reductions in size and profile, has satisfactory impact resistance, and can improve the yield. Therefore, the piezoelectric electronic components can be suitably used for filters, such as duplexers, in communication apparatuses, such as cellular phones.

Japanese Unexamined Patent Application Publication No. 8-162899 discloses a SAW filter including a protective member having a hollow structure, the protective member covering the SAW filter and being composed of a shield metal layer and a resin layer. In this structure disclosed in Japanese Unexamined Patent Application Publication No. 8-162899, to providing a connection to the exterior, there are the following problems.

When the connection to the exterior is made by bump bonding, to form a bump on a terminal electrode, the bump must be formed from the opening of the shield metal layer and the resin layer for forming the hollow portion.

However, when the bump is formed from the opening, the bump is brought into contact with the shield metal layer to disadvantageously cause a short. To prevent the contact of the bump to the shield metal layer, it is necessary to increase the opening in size. However, when the opening is increased in size, the strength of the shield metal layer and the resin layer is degraded. As a result, it is difficult to maintain the hollow structure.

Even if wire bonding is employed, it is necessary to prevent the contact between wire and the shield metal layer in forming the wire.

Thus, it is also necessary to increase the opening in size. When the opening is increased in size, the strength of the shield metal layer and the resin layer is degraded. As a result, it is difficult to maintain the hollow structure.

As has been described above, a piezoelectric electronic component of the present invention includes a piezoelectric element on a substrate, pads on the piezoelectric element, the pads inputting and outputting the input and output signals, and a sealing member covering the piezoelectric element and being remote from the piezoelectric element, wherein the sealing member includes a through hole on each of the pads, the through hole connecting an internal space with an external space, the internal space being ensured by providing the sealing member so that the sealing member is remote from the piezoelectric element, and an electrode is provided so as to occlude the through hole.

In the above structure, by providing the sealing member so that the sealing member is remote from the piezoelectric element in the structure, it is possible to protect the piezoelectric element without inhibiting the oscillations of the piezoelectric element, to provide the sealing member close to the piezoelectric element, and to achieve reductions in size and profile.

The invention claimed is:

1. A piezoelectric electronic component comprising:
a substrate;
a piezoelectric element provided on the substrate, the piezoelectric element oscillating in response to application of an input signal, and the piezoelectric element outputting an output signal corresponding to the oscillation,
a plurality of pads provided at the piezoelectric element;
a sealing member comprising an insulating film, the sealing member covering the piezoelectric element and being remote from the piezoelectric element, wherein the sealing member includes a through hole corresponding to each of the pads, the through hole connecting an internal space with an external space; and
an electrode occluding the through hole.

2. The piezoelectric electronic component according to claim 1, wherein the sealing member comprises at least one compound selected from the group consisting of a silicon nitride, a silicon oxide, an aluminum oxide, an aluminum nitride, a zinc oxide, a silicon oxynitride, and a tantalum nitride.

3. A piezoelectric electronic component comprising:
a substrate;
a piezoelectric element provided on the substrate, the piezoelectric element oscillating in response to application of an input signal, and the piezoelectric element outputting an output signal corresponding to the oscillation;
a plurality of pads provided at the piezoelectric element; and
a sealing member comprising an insulating film, the sealing member covering the piezoelectric element and being remote from the piezoelectric element,
wherein the sealing member comprises at least one compound selected from the group consisting of a silicon nitride, a silicon oxide, an aluminum oxide, an aluminum nitride, a zinc oxide, a silicon oxynitride, and a tantalum nitride.

4. The piezoelectric electronic component according to claim 1, wherein the sealing member has a multilayer structure and includes at least one film having a compressive stress and at least one film having a tensile stress.

5. The piezoelectric electronic component according to claim 4, wherein the film having a compressive stress comprises at least one compound selected from the group consisting of SiO2, ZnO, and TaN.

6. The piezoelectric electronic component according to claim 4, wherein the film having a tensile stress comprises at least one compound selected from the group consisting of Al2O3, SiN, and AlN.

7. The piezoelectric electronic component according to claim 1, wherein the sealing member has a multilayer structure, and the uppermost layer comprises a resin.

8. The piezoelectric electronic component according to claim 7, wherein the resin comprises at least one compound selected from the group consisting of a polyimide, an epoxy resin, a resist resin, and a liquid-crystalline polymer.

9. The piezoelectric electronic component according to claim 1, further comprising:
a connecting hole provided at the periphery of the sealing member, the connecting hole connecting the internal space of the sealing member with the external space, and
an electrode provided so as to occlude the connecting hole, the electrode inputting and outputting the input and output signals.

10. The piezoelectric electronic component according to claim 1, wherein the piezoelectric element is a piezoelectric resonator including a substrate having an opening or a depression and an exciter covering the opening or the depression, the exciter having a structure in which the upper and lower surfaces of a thin film portion including at least one piezoelectric thin film are sandwiched between at least one pair of an upper electrode and a lower electrode, the upper electrode and lower electrode being disposed opposite each other.

11. The piezoelectric electronic component according to claim 1, wherein the piezoelectric element is a piezoelectric filter including a plurality of piezoelectric resonators, each containing a substrate having an opening or a depression and an exciter covering the opening or the depression, the exciter having a structure in which the upper and lower surfaces of a thin film portion including at least one piezoelectric thin film are sandwiched between at least one pair of an upper electrode and a lower electrode, the upper electrode and lower electrode being disposed opposite each other.

12. The piezoelectric electronic component according to claim 1, wherein the piezoelectric element is a surface acoustic wave device having at least one interdigital electrode on a piezoelectric substrate.

13. The piezoelectric electronic component according to claim 1, wherein an electrical circuit is provided on the sealing member.

14. A communication apparatus comprising the piezoelectric electronic component according to claim 1.

15. The piezoelectric electronic component according to claim 3, wherein the sealing member has a multilayer structure and includes at least one film having a compressive stress and at least one film having a tensile stress.

16. The piezoelectric electronic component according to claim 15, wherein the film having a compressive stress comprises at least one compound selected from the group consisting of SiO2, ZnO, and TaN.

17. The piezoelectric electronic component according to claim 15, wherein the film having a tensile stress comprises at least one compound selected from the group consisting of Al2O3, SiN, and AlN.

* * * * *